(12) United States Patent
Kim et al.

(10) Patent No.: US 11,131,899 B2
(45) Date of Patent: Sep. 28, 2021

(54) DISPLAY APPARATUS

(71) Applicant: LG Display Co., Ltd., Seoul (KR)

(72) Inventors: Choonghyo Kim, Paju-si (KR); Jae-Hyun Kim, Paju-si (KR); Kihan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 164 days.

(21) Appl. No.: 16/416,757

(22) Filed: May 20, 2019

(65) Prior Publication Data

US 2019/0361310 A1 Nov. 28, 2019

(30) Foreign Application Priority Data

May 24, 2018 (KR) ........................ 10-2018-0059155

(51) Int. Cl.
*G02F 1/163* (2006.01)
*G02F 1/155* (2006.01)
(Continued)

(52) U.S. Cl.
CPC .............. *G02F 1/163* (2013.01); *G02F 1/155* (2013.01); *G02F 1/1533* (2013.01);
(Continued)

(58) Field of Classification Search
CPC ............. H01L 27/3232; H01L 51/5281; H01L 27/3262; H01L 2251/5323; H01L 27/322; H01L 27/3244; H01L 51/5268; H01L 2251/5315; H01L 27/3248; H01L 27/326; H01L 27/3276; H01L 51/0096; H01L 51/50; H01L 51/5228; H01L 51/5234; H01L 51/5284; G02F 1/133377; G02F 1/1337; G02F 2201/44; G02F 1/13475; G02F 1/13725; G02F 1/134309; G02F 1/13394; G02F 1/13737; G02F 2001/13345; G02F 2001/133742; G02F 1/1375; G02F 2001/13398; G02F 2201/14; G02F 2202/043; G02F 2203/01; G02F 1/133305; G02F 1/133504; G02F 1/133603; G02F 1/13439; G02F 1/136286; G02F 1/1368; G02F 2001/133354; G02F 2001/133612; G02F 2202/28; G02F 1/1334;
(Continued)

(56) References Cited

U.S. PATENT DOCUMENTS

2008/0089527 A1\* 4/2008 Shou ...................... H04R 19/04
381/67
2017/0097537 A1\* 4/2017 Park .................... G02F 1/13475

\* cited by examiner

*Primary Examiner* — Brandi N Thomas
(74) *Attorney, Agent, or Firm* — Morgan, Lewis & Bockius LLP

(57) ABSTRACT

A display apparatus includes: a display panel including: a transmissive area configured to transmit light incident thereon, and an emissive area configured to emit light, a light-controlling device on a rear surface of the display panel, the light-controlling device being configured to have a light transmission mode for transmitting the incident light and a light-blocking mode for blocking the incident light, the light-controlling device including: a first substrate and a second substrate facing each other, a transmission controller between the first substrate and the second substrate, the transmission controller overlapping the transmissive area, and a vibration generator between the first substrate and the second substrate, the vibration generator overlapping the emissive area.

25 Claims, 9 Drawing Sheets

(51) Int. Cl.
*G02F 1/153* (2006.01)
*H01L 27/32* (2006.01)

(52) U.S. Cl.
CPC ........ *H01L 27/322* (2013.01); *H01L 27/3244* (2013.01); *G02F 2201/121* (2013.01); *G02F 2201/44* (2013.01)

(58) Field of Classification Search
CPC ........... G02F 1/133502; G02F 1/13718; G02F 1/1533; G02F 1/155; G02F 1/163; G02F 2201/121; G02F 1/1333; G02F 1/133555; G02F 1/1339; G02F 1/134363; G02F 1/13476; G02F 2001/133394; G02F 2001/13347; G02F 2001/133565; G02F 2001/134372; G02F 2001/134381; G02F 2001/13756; G02F 2001/13775; G02F 2202/04; G02F 2203/03; G02F 2203/34; G02F 2203/64; G02F 1/1313; G02F 1/1365; G02B 5/223; G02B 26/001; G02B 5/18; G02B 5/208; G02B 5/1861; G02B 5/201; G02B 5/205; G02B 5/285; G02B 5/32
See application file for complete search history.

DISPLAY APPARATUS

CROSS-REFERENCE TO RELATED APPLICATION(S)

This application claims the benefit of and priority to Korean Patent Application No. 10-2018-0059155, filed on May 24, 2018, the entirety of which is hereby incorporated by reference.

BACKGROUND

1. Technical Field

The present disclosure relates to a display apparatus.

2. Discussion of the Related Art

Recently, as society advances toward an information-oriented society, the field of display apparatuses for visually expressing an electrical information signal has rapidly advanced. Various display apparatuses, having excellent performance in terms of thinness, lightness, and low power consumption, are being developed correspondingly. Examples of the display apparatuses include liquid crystal display (LCD) apparatuses, field emission display (FED) apparatuses, organic light-emitting display apparatuses, etc.

Recent display apparatuses are being made thin, light in weight, and low in power consumption. Thus, the application field of display apparatuses is continuously increasing. For example, display apparatuses are used as a user interface in electronic devices, mobile device, and the like.

Moreover, recently, research is being actively done on transparent display apparatuses that enable a user to see something or a rear scene located behind a display apparatus. The transparent display apparatuses may be good in space usage, interior, and design, and may be applied to various fields. The transparent display apparatuses may each be implemented as a transparent electronic device having an information recognition function, an information processing function, and an information display function, and may solve the spatial limitation and temporal limitation of electronic devices. For example, the transparent display apparatuses may each be implemented as a smart window that is applied to a window of each building or vehicle and enables a user to see a background or displays an image.

The transparent display apparatuses may each be implemented as an organic light-emitting display apparatus. For example, the transparent display apparatuses are low in power consumption. However, a contrast ratio is normal in a dark environment, but a contrast ratio is reduced in a normal environment having ambient light. Therefore, when a transparent display apparatus is implemented as an organic light-emitting display apparatus, the transparent display apparatus needs a light-controlling device for realizing a light-blocking mode of blocking light and a light transmission mode of transmitting light to prevent a contrast ratio from being reduced.

Recently, technology for using an electrochromic device as a light-controlling device is being proposed. The electrochromic device may perform the light transmission mode of transmitting light in a state in which a voltage is not applied thereto, and may change the light transmission mode to the light-blocking mode with a low driving voltage. However, when the electrochromic device is applied to the light-controlling device of a transparent display apparatus having a large screen, such as televisions (TVs), a long time is taken in changing the light transmission mode to the light-blocking mode or changing the light-blocking mode to the light transmission mode due to a slow response time of the electrochromic device.

Display apparatuses display an image on a display panel, but a separate speaker should be installed for generating sound. When a speaker is installed in a display apparatus, a traveling direction of sound output through the speaker is a direction toward a side portion or an upper/lower portion of the display panel, instead of toward a front or a rear of the display panel. Thus, sound does not travel in a direction toward a viewer who is watching an image in front of the display panel, whereby an immersion experience of the viewer watching the image is hindered.

Moreover, when a speaker included in a set apparatus, such as a TV, is provided, the speaker occupies a certain space, and due to this, the design and space disposition of the set apparatus are limited. To solve such a problem, display apparatuses include a separate vibration generating device that vibrates a display panel to output sound toward a forward region in front of the display panel. However, due to a size of the vibration generating device, it is difficult to implement a thin film type display apparatus. Also, transparent display apparatuses have a problem in which, even when a vibration generating device is disposed on a rear surface of a display apparatus, the vibration generating device is visible. To solve such a problem, it is desirable to develop display apparatuses that are capable of being transparent without an increase in size thereof.

SUMMARY

Accordingly, the present disclosure is directed to a display apparatus that substantially obviates one or more of the issues due to limitations and disadvantages of the related art.

An aspect of the present disclosure is to provide a display apparatus that outputs sound toward a forward region in front of the display apparatus by using a light-controlling device, including a vibration generator overlapping an emissive area of a display panel.

Another aspect of the present disclosure is to provide a display apparatus that independently drives each of a transmission controller and a vibration generator of a light-controlling device to output sound toward a forward region in front of the display apparatus in a light transmission mode or a light-blocking mode.

Another aspect of the present disclosure is to provide a display apparatus that outputs sound toward a forward region in front of a display panel to match an image-generating position with a sound-generating position, thereby increasing or maximizing a sense of reality and an immersion experience.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel including: a transmissive area configured to transmit light incident thereon, and an emissive area configured to emit light, a light-controlling device on a rear surface of the display panel, the light-controlling device being configured to have a light transmission mode for transmitting the incident light and a light-blocking mode for blocking the incident light, the light-controlling device including: a first substrate and a second substrate facing each other, a transmission controller between the first substrate and the second substrate, the transmission controller overlapping the transmissive area, and a vibration generator between the first substrate and the second substrate, the vibration generator overlapping the emissive area.

In another aspect, there is provided a display apparatus, including: a display panel including: a transmissive area, and an emissive area, and a light-controlling device on a rear surface of the display panel, the light-controlling device including: a transmission controller corresponding to the transmissive area, and a vibration generator corresponding to the emissive area, and a sound-absorbing member around the vibration generator.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
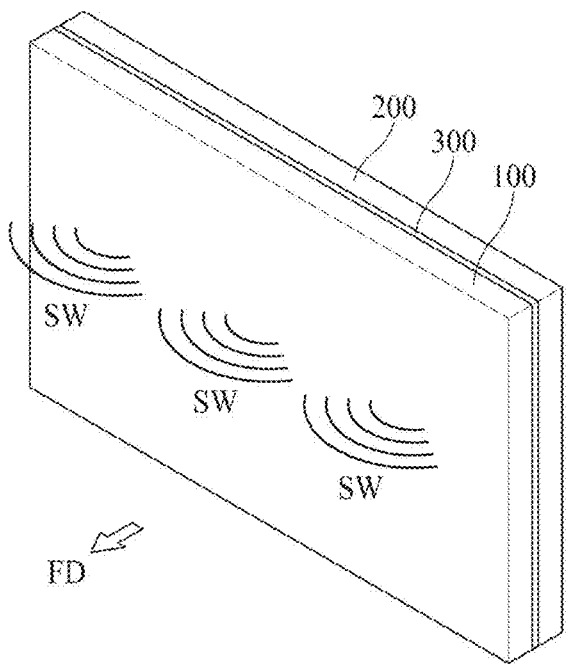
FIG. 1 is a perspective view illustrating a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In the present disclosure, examples of a display apparatus may include a narrow-sense display apparatus such as an organic light-emitting display (OLED) module or a liquid crystal module (LCM) including a display panel and a driver for driving the display panel. Also, examples of the display apparatus may include a set apparatus or a set electronic apparatus, such as a notebook computer, a television (TV), a computer monitor, an automotive display or another type of equipment display including for vehicles, and/or a mobile electronic apparatus such as a smartphone or an electronic pad, which is a complete product (or a final product) that includes an LCM or an OLED module. Therefore, in the present disclosure, examples of the display apparatus may include a narrow-sense display apparatus itself, such as an LCM or an OLED module, and a set apparatus that is a final consumer apparatus or an application product including the LCM or the OLED module.

Depending on the case, an LCM or an OLED module including a display panel and a driver may be referred to as a narrow-sense display apparatus, and an electronic apparatus that is a final product including an LCM or an OLED module may be referred to as a set apparatus. For example, the narrow-sense display apparatus may include a display panel, such as an LCD or an OLED, and a source printed circuit board (PCB), which is a controller for driving the display panel. The set apparatus may further include a set PCB, which is a set controller electrically connected to the source PCB to overall control the set apparatus.

A display panel applied to the present embodiment may use any type of display panel, such as a liquid crystal display panel, an organic light-emitting diode (OLED) display panel, and an electroluminescent display panel, but is not limited to any particular display panel that may be vibrated by a sound-generation device according to an embodiment to output sound. Also, a shape or a size of a display panel applied to a display apparatus according to the present embodiment is not limited.

For example, if the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT), which is a switching element for adjusting a light transmittance of each of the plurality of pixels, an upper substrate including a color filter and/or a black matrix, and a liquid crystal layer between the array substrate and the upper substrate.

Moreover, if the display panel is the organic light-emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT, which is an element for selectively applying a voltage to each of the pixels, an organic light-emitting device layer on the array substrate, and an encapsulation substrate disposed on the array substrate to cover the organic light-emitting device layer. The encapsulation substrate may protect the TFT and the organic light-emitting device layer from an external impact and may prevent water or oxygen from penetrating into the organic light-emitting device layer. Also, a layer provided on the array substrate may include an inorganic light-emitting layer (for example, a nano-sized material layer, a quantum dot, or the like). Alternatively, the layer provided on the array substrate may include a micro light-emitting diode.

Hereinafter, a display apparatus according to an embodiment of the present disclosure will be described in detail with reference to the accompanying drawings. In adding reference numerals to elements of each of the drawings, although the same elements are illustrated in other drawings, like reference numerals may refer to like elements.

Figure 2:
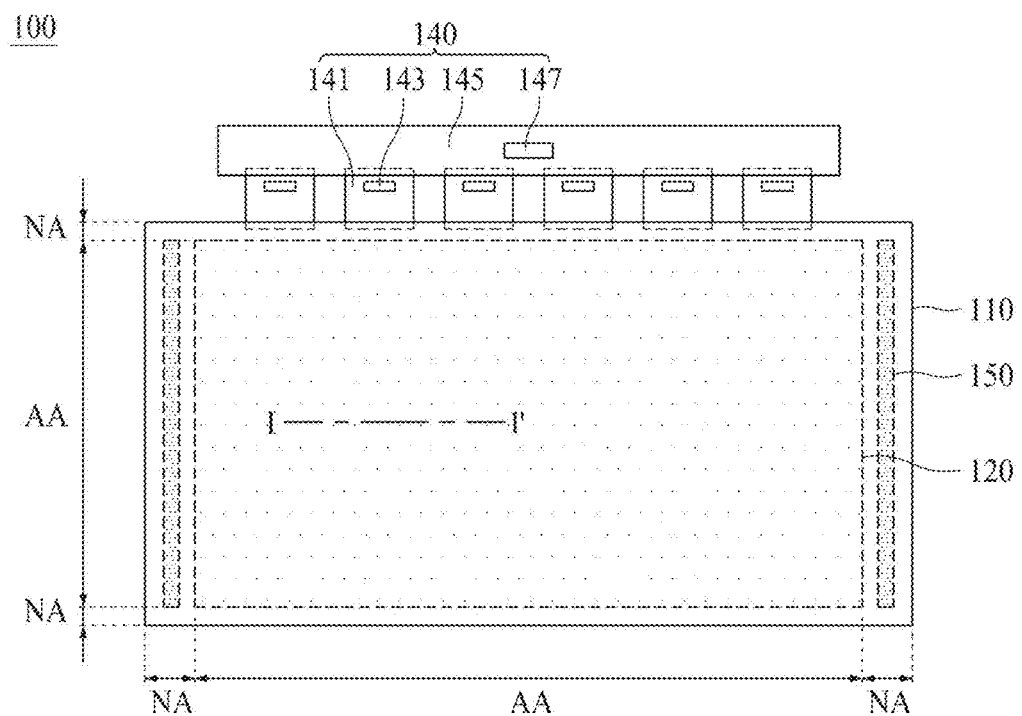
FIG. 2 is a plan view illustrating a display panel of FIG. 1.
Figure 3:
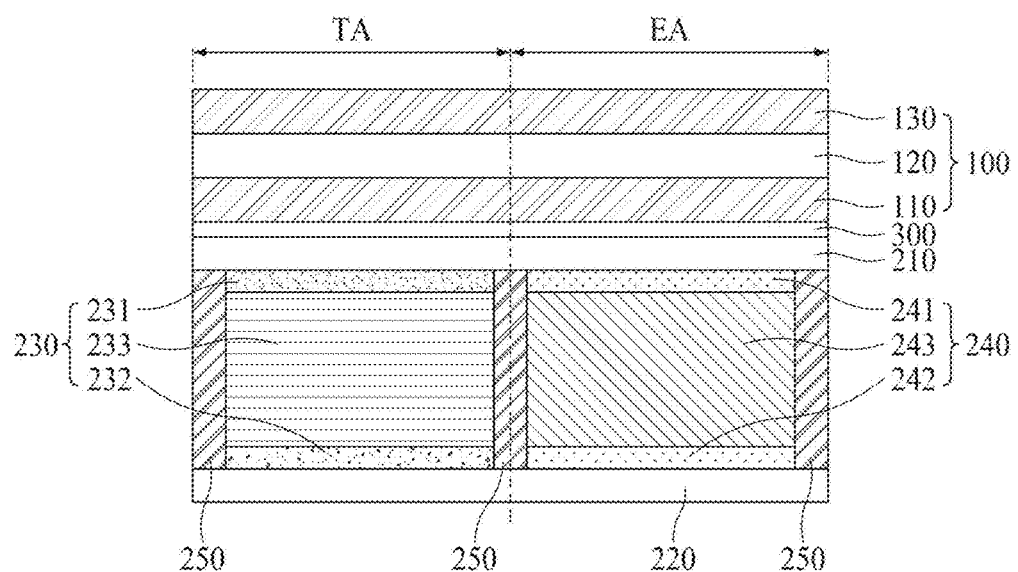
FIG. 3 is a cross-sectional view of a display apparatus according to an embodiment of the present disclosure.
Figure 4:
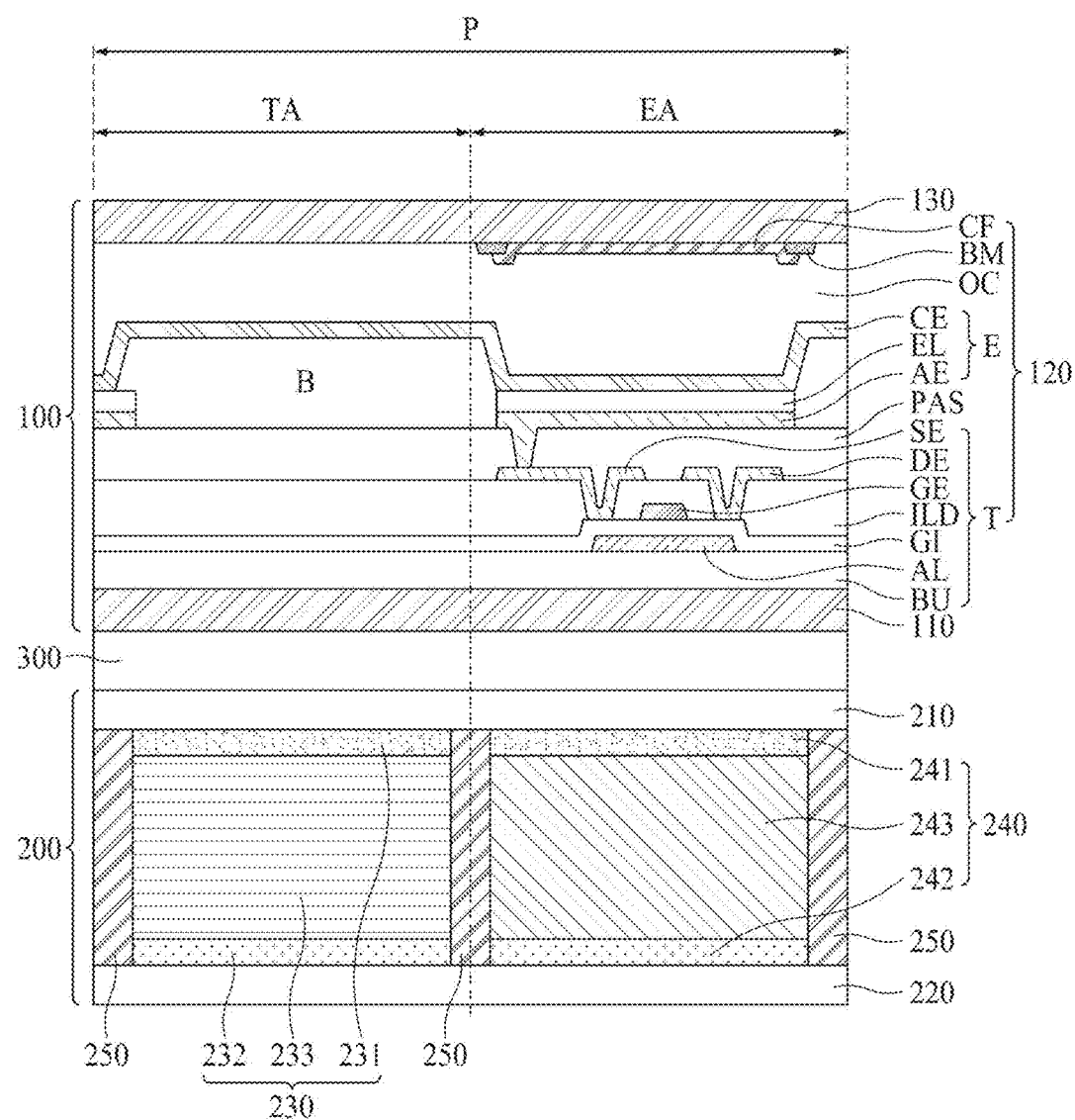
FIG. 4 is a cross-sectional view of a display apparatus according to an embodiment of the present disclosure.
Figure 5:
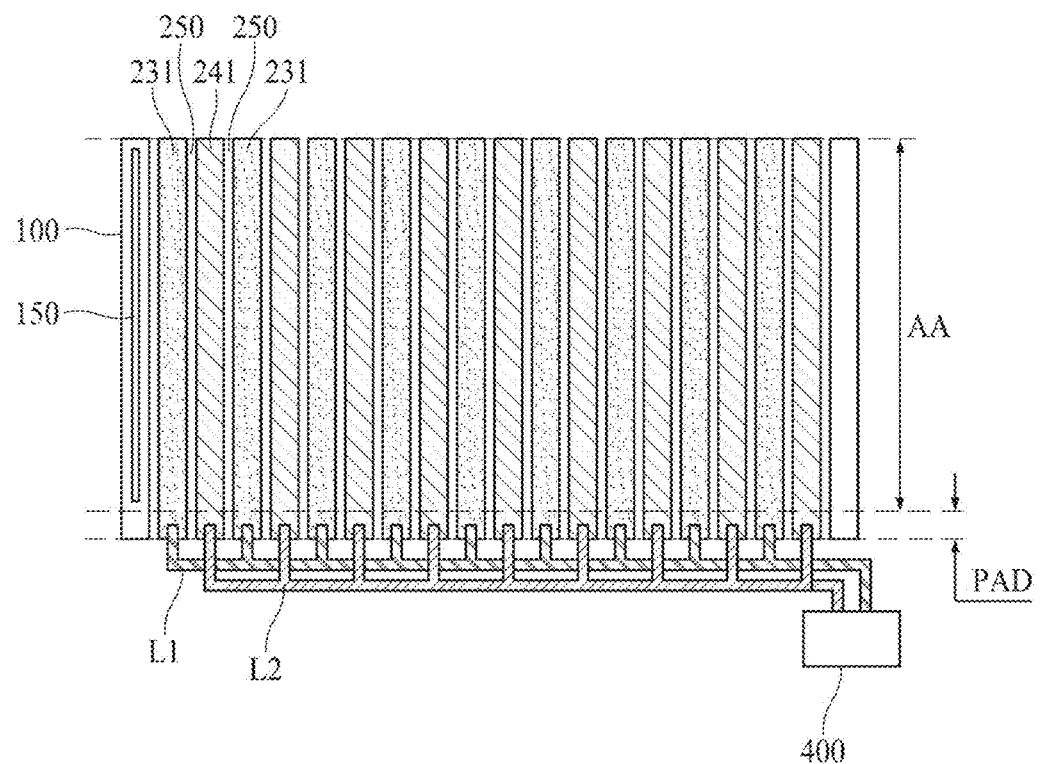
FIG. 5 is a plan view illustrating an arrangement of electrodes and lines in a display apparatus according to an embodiment of the present disclosure.

FIG. 1 is a perspective view illustrating a display apparatus according to an embodiment of the present disclosure. FIG. 2 is a plan view illustrating a display panel of FIG. 1. FIG. 3 is a cross-sectional view of a display apparatus according to an embodiment of the present disclosure. FIG. 4 is a cross-sectional view of a display apparatus according to an embodiment of the present disclosure. FIG. 5 is a plan view illustrating an arrangement of electrodes and lines in a display apparatus according to an embodiment of the present disclosure.

With reference to FIGS. 1 to 5, the display apparatus may include a display panel 100, a light-controlling device 200, and an adhesive layer 300. Hereinafter, an example in which the display apparatus is implemented as an organic light-emitting display apparatus will be mainly described, but the display apparatus may be implemented, for example, as an LCD apparatus or an electrophoresis display apparatus. Also, a light-emitting display apparatus may be applied to a bottom-emission display apparatus, a top-emission display apparatus, and a dual-emission display apparatus, but is not limited thereto.

The display panel 100 may include a lower substrate 110, a pixel array layer 120, and an upper substrate 130. The lower substrate 110 as a base substrate may be a flexible substrate. For example, the lower substrate 110 may include a transparent polyimide material. Considering that a high-temperature deposition process may be performed on the lower substrate 110 including polyimide, the polyimide, which has good heat resistance and endures a high temperature, may be used. The lower substrate 110 including polyimide may be formed by curing a polyimide resin, which is coated to have a certain thickness, on a front surface of a sacrificial layer on a carrier glass substrate. Here, the carrier glass substrate may be separated from the lower substrate 110 by releasing the sacrificial layer through a laser release process. Also, the sacrificial layer may include amorphous silicon (a-Si) or silicon nitride ($SiN_x$).

According to an embodiment, the lower substrate 110 may be a glass substrate. For example, the lower substrate 110 may include one or more of: silicon dioxide ($SiO_2$) and aluminum oxide ($Al_2O_3$) as main components.

The lower substrate 110 may include a display area AA and a non-display area NA. The display area AA may be an area that displays an image, and may be a center portion of the lower substrate 110. Here, the display area AA may correspond to an active area of the pixel array layer 120. For example, the display area AA may include a plurality of pixels P respectively in a plurality of pixel areas by intersections of a plurality of gate lines and a plurality of data lines. Alternatively, the display area AA may include the plurality of pixels P provided by the plurality of gate lines and the plurality of data lines. Here, each of the plurality of pixels may be a unit area at a minimum that emits light.

Each of the pixels P of the display area AA may include a transmissive area TA and an emissive area EA, as in the examples of FIGS. 3 and 4. The emissive area EA may include a plurality of light-emitting parts. The display panel 100 may enable a user to see a thing (or object) or a scene located behind the display apparatus using a plurality of transmissive areas TA, and may display an image using a plurality of emissive areas EA.

The transmissive area TA may transmit light incident thereon nearly as-is. The emissive area EA may be an area that emits light, and each of the pixels P may include a plurality of subpixels in the emissive area EA. For example, a red subpixel of the emissive area EA may emit red light, a green subpixel may emit green light, and a blue subpixel may emit blue light. Here, the emissive area EA may correspond to an opaque area that blocks light incident thereon. The non-display area NA may be an area that does not display an image, and may be a periphery portion of the lower substrate 110 surrounding the display area AA.

The pixel array layer 120 may include a buffer layer BU, a thin film transistor (TFT) T, a passivation layer PAS, a light-emitting device E, a bank B, an overcoat layer OC, a color filter CF, and a black matrix BM. The light-emitting device E may be an organic light-emitting device or an inorganic light-emitting device. The TFT T may be in the display area AA of the substrate 110. The TFT T may include a semiconductor layer AL, a gate insulation layer GI, a gate electrode GE, an interlayer insulation layer ILD, a drain electrode DE, and a source electrode SE.

The semiconductor layer AL may be in the display area AA of the lower substrate 110. The semiconductor layer AL may overlap the gate electrode GE, the drain electrode DE, and the source electrode SE. The semiconductor layer AL may directly contact the drain electrode DE and the source electrode SE, and may face the gate electrode GE with the gate insulation layer GI therebetween. A buffer layer BU may be between the semiconductor layer AL and the lower substrate 110.

The gate electrode GE may be on the gate insulation layer GI. The gate electrode GE may overlap the semiconductor layer AL.

The drain electrode DE and the source electrode SE may be spaced apart from each other on the interlayer insulation layer ILD. The drain electrode DE may contact one portion of the semiconductor layer AL through a first contact hole, which is in the gate insulation layer GI and the interlayer insulation layer ILD, and the source electrode SE may contact the other portion of the semiconductor layer AL through a second contact hole, which is in the gate insulation layer GI and the interlayer insulation layer ILD. The source electrode SE may directly contact an anode electrode AE of the light-emitting device E through a third contact hole of the passivation layer PAS.

The gate insulation layer GI may be on the semiconductor layer AL. For example, the gate insulation layer GI may be on the semiconductor layer AL and the lower substrate 110, and may insulate the semiconductor layer AL from the gate electrode GE. Also, the gate insulation layer GI may be an entire surface of the display area AA of the lower substrate 110. For example, the gate insulation layer GI may include the first contact hole through which the drain electrode DE passes and the second contact hole through which the source electrode SE passes.

The interlayer insulation layer ILD may be on the gate electrode GE. For example, the interlayer insulation layer ILD may include the first contact hole through which the drain electrode DE passes and the second contact hole through which the source electrode SE passes. Here, each of the first contact hole and the second contact hole of the interlayer insulation layer ILD may connect with the first contact hole or the second contact hole of the gate insulation layer GI.

The passivation layer PAS may be on the TFT T, and may planarize an upper portion of the TFT T. For example, the passivation layer PAS may include the third contact hole through which the anode electrode AE passes.

The light-emitting device E may be on the passivation layer PAS, and may be electrically connected to the TFT T. The light-emitting device E may include the anode electrode AE, a light-emitting layer EL, and a cathode electrode CE. Also, the light-emitting layer EL may include an organic light-emitting layer, an inorganic light-emitting layer, or a micro light-emitting diode.

The anode electrode AE may be on the passivation layer PAS. For example, the anode electrode AE may overlap an opening region of the light-emitting device E defined by the bank B. Also, the anode electrode AE may contact the source electrode SE of the TFT T through the third contact hole in the passivation layer PAS. According to an embodiment, the anode electrode AE may include a transparent conductive material, and may act as an anode.

The light-emitting layer EL may be on the anode electrode AE. According to an embodiment, the light-emitting layer EL may not be divided by units of pixel areas, and may be implemented in an organic layer form, which is common to all of the pixels P. Also, the light-emitting layer EL may be on the bank B, as well as the anode electrode AE. Here, the light-emitting layer EL may include a hole transporting layer, an electron transporting layer, etc.

The cathode electrode CE may be on the light-emitting layer EL. For example, the cathode electrode CE may not be divided by units of pixel areas, and may be implemented in an electrode form, which is common to all of the pixels P. When a voltage is applied to the anode electrode AE and the cathode electrode CE, a hole and an electron may respectively move to the light-emitting layer through the hole transporting layer and the electron transporting layer, and may be combined in the light-emitting layer to emit light. The cathode electrode CE may act as a cathode of the light-emitting device E.

The bank B may be on the passivation layer PAS. For example, the bank B may be between anode electrode AE adjacent to each other, and may divide the anode electrodes AE. Therefore, the bank B may electrically insulate adjacent anode electrodes AE, and may be an opening region of the light-emitting device E.

The overcoat layer OC may cover the light-emitting device E. For example, the overcoat layer OC may be in a whole (or entire) upper portion of the cathode electrode CE. The overcoat layer OC may reduce or prevent penetration of water or moisture flowing in from the outside to reduce or prevent degradation in the light-emitting layer EL.

The color filter CF may be on the overcoat layer OC, and may correspond to the light-emitting layer EL of the light-emitting device E. For example, the color filter CF may be surrounded by the black matrix BM, which may be patterned on the overcoat layer OC. The color filter CF may be provided in plurality, and the plurality of color filters CF may be spaced apart from one another to respectively correspond to a plurality of light-emitting layers EL of the light-emitting device E. Also, the plurality of color filters CF may respectively correspond to the plurality of light-emitting layers EL of the light-emitting device E, and each of the color filters CF may convert a color of white light emitted from the light-emitting device E. For example, the color filters CF may include a red color filter, a green color filter, and a blue color filter. Therefore, a red subpixel, a green subpixel, and a blue subpixel of the plurality of subpixels may each include a corresponding color filter CF, and a white subpixel may be implemented without a color filter.

The black matrix BM may be patterned on one surface of the upper substrate 130 facing the lower substrate 110. For example, the black matrix BM may be provided, and each of the plurality of the black matrixes BM may be between two adjacent color filters CF of the plurality of color filters CF, and may divide the plurality of color filters CF. For example, the black matrix BM may surround the opening region of the light-emitting device E, and may block light incident on the TFT T.

With reference to FIG. 2, the display driving circuit 140 may be connected to a pad part in the non-display area NA of the lower substrate 110, and may allow each pixel to display an image corresponding to video data supplied from a display driving system. According to an embodiment, the display driving circuit 140 may include a plurality of circuit films 141, a plurality of data driving integrated circuits (ICs) 143, a printed circuit board (PCB) 145, and a timing controller 147.

Input terminals on one portion of each of the plurality of circuit films 141 may be attached on the PCB 145 through a film attachment or assembly process, and output terminals on the other portion of each of the plurality of circuit films 141 may be attached on the pad part through the film attachment or assembly process. According to an embodiment, each of the plurality of circuit films 141 may be implemented as a flexible circuit film, e.g., for reducing a bezel area of the display panel 100.

Each of the plurality of data driving ICs 143 may be individually mounted on a corresponding circuit film 141. Each of the plurality of data driving ICs 143 may receive pixel data and a data control signal from the timing controller 147, may convert the pixel data into a pixel-based analog data signal according to the data control signal, and may supply the analog data signal to a corresponding data line.

The PCB 145 may support the timing controller 147, and may transfer signals and power between elements of the display driving circuit unit 140. The timing controller 147 may be mounted on the PCB 145, and may receive the video data and a timing synchronization signal from the display driving system through a user connector on the PCB 145. The timing controller 147 may align the video data to generate pixel data matching a pixel arrangement structure, based on the timing synchronization signal, and may provide the generated pixel data to a corresponding data driving IC 143. Also, the timing controller 147 may generate the data control signal and a scan control signal based on the timing synchronization signal, may control a driving timing of each of the plurality of data driving ICs 143 according to the data control signal, and may control a driving timing of the scan driving circuit unit 150 according to the scan control signal.

The scan driving circuit unit 150 may be in the non-display area NA of the lower substrate 110. The scan driving circuit unit 150 may generate a scan signal according to the scan control signal from the display driving circuit unit 140, and may supply the scan signal to a scan line corresponding to a certain order.

The light-controlling device 200 may be on a rear surface of the display panel 100. In a light transmission mode, the light-controlling device 200 may transmit light incident thereon, and in a light-blocking mode, the light-controlling device 200 may block light incident thereon. For example, the light-controlling device 200 may include a first substrate 210, a second substrate 220, a transmission controller 230, a vibration generator 240, and a partition wall 250.

The first substrate 210 may be bonded or attached to the second substrate 220 to face each other. For example, each of the first and second substrates 210 and 220 may be a base substrate, and may be a flexible substrate. For example, each of the first and second substrates 210 and 220 may include a transparent polyimide material. For example, each of the first and second substrates 210 and 220 may use a sheet or a film, which may include, for example, one or more of: a cellulose resin, such as triacetyl cellulose (TAC) or diacetyl cellulose (DAC); cyclic olefin polymer (COP), such as norbornene derivatives; an acryl resin, such as cyclic olefin copolymer (COC) or poly(methylmethacrylate) (PMMA); polyolefin, such as polycarbonate (PC), polyethylene (PE), or polypropylene (PP); polyester, such as polyvinyl alcohol (PVA), poly ether sulfone (PES), polyetheretherketone (PEEK), polyetherimide (PEI), polyethylenenaphthalate (PEN), or polyethyleneterephthalate (PET); polyimide (PI); polysulfone (PES); and a fluoride resin, but is not limited thereto.

The transmission controller 230 may be between the first and second substrates 210 and 220, and may overlap the transmissive area TA of the display panel 100. For example, the transmission controller 230 may include a first electrode 231, a second electrode 232, and an electrochromic layer 233.

The first electrode 231 may be on one surface of the first substrate 210 facing the second substrate 220, and may overlap the transmissive area TA of the display panel 100. For example, the first electrode 231 may be patterned on the one surface of the first substrate 210 to overlap the transmissive area TA of each of the plurality of pixels P of the display panel 100. The first electrode 231 may be connected to a first line L1 at a pad part PAD of the first substrate 210, and may be provided with a first electric signal from the driving circuit unit 400 through the first line L1. Here, the first electric signal may correspond to a data signal for determining the electrical color conversion of the electrochromic layer 233.

The second electrode 232 may be on one surface of the second substrate 220 facing the first substrate 210, and may correspond to the first electrode 231 overlapping the transmissive area TA of the display panel 100. For example, the second electrode 232 may be patterned on the one surface of the second substrate 220 to correspond to the first electrode 231, which may be patterned on the one surface of the first substrate 210.

The electrochromic layer 233 may be between the first and second electrodes 231 and 232. When a voltage is applied to the first and second electrodes 231 and 232, a color of the electrochromic layer 233 may be electrically converted. According to an embodiment, the electrochromic layer 233 may include a color conversion layer, an electrolyte layer, and a counter layer. For example, the driving circuit unit 400 may provide the first electric signal to the first electrode 231 through the first line L1, and may provide the second electrode 232 with a signal differing from the first electric signal. When a voltage is applied to the first and second electrodes 231 and 232, an electrochemical oxidation-reduction reaction may be performed in the electrochromic layer 233. Thus, a color of the electrochromic layer 233 may be converted.

For example, when a positive data voltage is applied to the first electrode 231 and a common voltage is applied to the second electrode 232, an oxidation reaction may be performed in the counter layer adjacent to the first electrode 231, and a reduction reaction may be performed in the color conversion layer adjacent to the second electrode 232. For example, the color of the electrochromic layer 233 may be converted into a certain color, such as black, based on the reduction reaction, e.g., the electrochromic layer 233 may become opaque. Thus, the electrochromic layer 233 may block light incident thereon and the light-controlling device 200 may perform the light-blocking mode.

On the other hand, when a negative data voltage is applied to the first electrode 231 and the common voltage is applied to the second electrode 232, a reduction reaction may be performed in the counter layer adjacent to the first electrode 231, and an oxidation reaction may be performed in the color conversion layer adjacent to the second electrode 232. For example, the color of the electrochromic layer 233 may be converted transparently (e.g., may become transparent), based on the oxidation reaction. Thus, the electrochromic layer 233 may transmit light incident thereon as-is, and the light-controlling device 200 may perform the light transmission mode.

According to another embodiment, the electrochromic layer 233 may include a liquid crystal, a dichroic dye, and an ion material. For example, when the driving circuit unit 400 does not apply a voltage to the first and second electrodes 231 and 232, the electrochromic layer 233 may transmit light incident thereon as-is and the light-controlling device 200 may perform the light transmission mode. On the other hand, when the driving circuit unit 400 applies a voltage to the first and second electrodes 231 and 232, the electrochromic layer 233 may block light incident thereon and the light-controlling device 200 may be configured to perform the light-blocking mode.

The vibration generator 240 may be between the first and second substrates 210 and 220, and may overlap the emissive area EA of the display panel 100. Therefore, the vibration generator 240 may overlap each of the TFT T, the light-emitting device E, and the color filter CF of the display panel 100. For example, the vibration generator 240 may include a third electrode 241, a fourth electrode 242, and a vibration generating layer 243.

The third electrode 241 may be on the one surface of the first substrate 210 facing the second substrate 220, and may overlap the emissive area EA of the display panel 100. For example, the third electrode 241 may be patterned on the one surface of the first substrate 210 to overlap the emissive area EA of each of the plurality of pixels P of the display panel 100. As described above, the first electrode 231 and the third electrode 241 may be alternately disposed on the one surface of the first substrate 210 so that the first electrode 231 overlaps the transmissive area TA of the display panel 100 and the third electrode 241 overlaps the emissive area EA of the display panel 100. The third electrode 241 may be connected to a second line L2 at the pad part PAD of the first substrate 210, and may be provided with a second electric signal from the driving circuit unit 400 through the second line L2. Here, the second line L2 may be electrically insulated from the first line L1, and the second electric signal may be generated based on sound data, and thus may correspond to a sound signal for determining a vibration of the vibration generating layer 243.

The fourth electrode 242 may be on the one surface of the second substrate 220 facing the first substrate 210, and may correspond to the third electrode 241 overlapping the emissive area EA of the display panel 100. For example, the fourth electrode 242 may be patterned on the one surface of the second substrate 220 to correspond to the third electrode 241, which may be patterned on the one surface of the first substrate 210.

The vibration generating layer 243 may be between the third and fourth electrodes 241 and 242. When a voltage is applied to the third and fourth electrodes 241 and 242, the vibration generating layer 243 may vibrate to output sound. For example, the driving circuit unit 400 may provide the second electric signal to the third electrode 241 through the second line L2, and may provide the fourth electrode 242 with a signal differing from the second electric signal. When a voltage is applied to the third and fourth electrodes 241 and 242, the vibration generating layer 243 may vibrate with a magnetic field based on an inverse piezoelectric effect.

According to an embodiment, the light-controlling device 200 may control a sound signal provided to the third and fourth electrodes 241 and 242 to vibrate the vibration generator 240, and may transfer a vibration to the display panel 100, thereby outputting sound SW to a forward region in front of the display apparatus. Therefore, the display apparatus may output the sound SW to the forward region in front of the display apparatus, even without a separate vibration generating device. Thus, an image-generating position may match a sound-generating position of the sound SW, thereby enhancing an immersion experience of a viewer watching an image and enhancing a degree of design freedom of the display apparatus.

Moreover, in the display apparatus according to an embodiment, to realize the light transmission mode, the transmission controller 230 of the light-controlling device 200 corresponding to the transmissive area TA of the display panel 100 may be transparent. For example, in the display apparatus according to the present disclosure, when the transmission controller 230 is transparent, regardless of whether the emissive area EA of the display panel 100 is transparent, the light transmission mode may be realized. Therefore, the vibration generator 240 may overlap the emissive area EA of the display panel 100, and thus, may not be seen. Therefore, in the display apparatus according to the present disclosure, the vibration generator 240 may correspond to the emissive area EA of the light-controlling device 200. Thus, the light transmission mode and the light-blocking mode may be realized, and the sound SW may be output toward a forward region FD in front of the display apparatus.

According to an embodiment, the vibration generating layer 243 may include a piezoelectric material having a piezoelectric effect. Here, the piezoelectric effect may be a characteristic in which, when an external force is applied, electrical polarization occurs to cause a potential difference, but when a voltage is applied, deformation or a deformation force occurs. For example, the piezoelectric material may include piezopolymer including one or more of: a polyvinylidene fluoride (PVDF) homopolymer, a PVDF copolymer, a PVDF terpolymer, a cyano-polymer, a cyano-copolymer, and a boron nitride (BN) polymer, but is not limited thereto. Here, the PVDF copolymer may be, for example, polyvinylidene fluoride trifluoroethylene P(VDF-TrFe), PVDF-TFE, PVDF-CTFE, or PVDF-CFE, but is not limited thereto. Also, the PVDF terpolymer may be, for example, PVDF-TrFe-CFE or PVDF-TrFE-CTFE, but is not limited thereto. Also, the cyano-copolymer may be, for example, PVDCN-vinyl acetate or PVDCN-vinyl propionate, but is not limited thereto. Also, the BN polymer may be, for example, polyaminoborane or polyaminodifluoroborane, but is not limited thereto.

The partition wall 250 may be between the transmission controller 230 and the vibration generator 240 in a state of maintaining an interval or distance between the first and second substrates 210 and 220. For example, the partition wall 250 may be provided in plurality, and each of the plurality of partition walls 250 may be between adjacent transmission controllers 230 and vibration generators 240 among a plurality of transmission controllers 230 and vibration generators 240, which may be alternately disposed, and thus, may divide the transmission controllers 230 and the vibration generators 240. Also, the partition wall 250 may be on the first substrate 210, and may perform a function of a mask in a process of patterning the first electrode 231 and the third electrode 241. Alternatively, the partition wall 250 may be on the second substrate 220, and may perform a function of a mask in a process of patterning the second electrode 232 and the fourth electrode 242. For example, the partition wall 250 may be formed of one or more of: a photoresist having a transparent material, a photocurable polymer, and polydimethylsiloxane, but is not limited thereto.

The adhesive layer 300 may attach the display panel 100 to the light-controlling device 200. The adhesive layer 300 may be a transparent adhesive film, such as an optically clear adhesive (OCA), and/or a transparent adhesive, such as an optically clear resin (OCR). According to an embodiment, the adhesive layer 300 may have a refractive index of about 1.4 to about 1.9, for refractive index matching between the display panel 100 and the light-controlling device 200.

The light-controlling device 200 may further include the driving circuit unit 400. The driving circuit unit 400 may provide a respective independent electric signal to each of the first electrode 231 and the third electrode 241. For example, the driving circuit unit 400 may provide the first electric signal to the first electrode 231 through the first line L1, and may provide the second electric signal to the third electrode 241 through the second line L2 electrically insulated from the first line L1.

Figure 6:
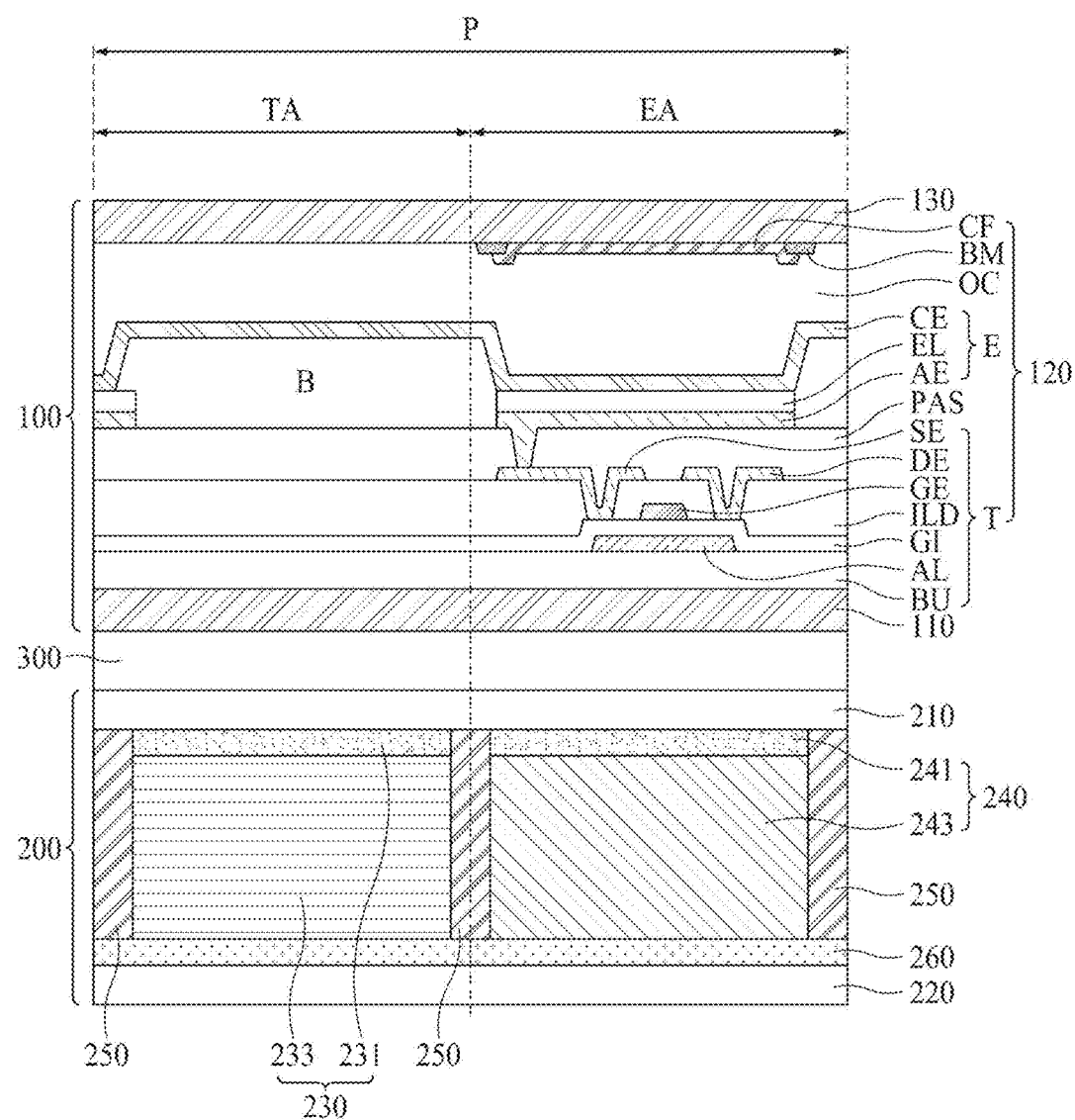
FIG. 6 is a cross-sectional view of a display apparatus according to another embodiment of the present disclosure.
Figure 7:
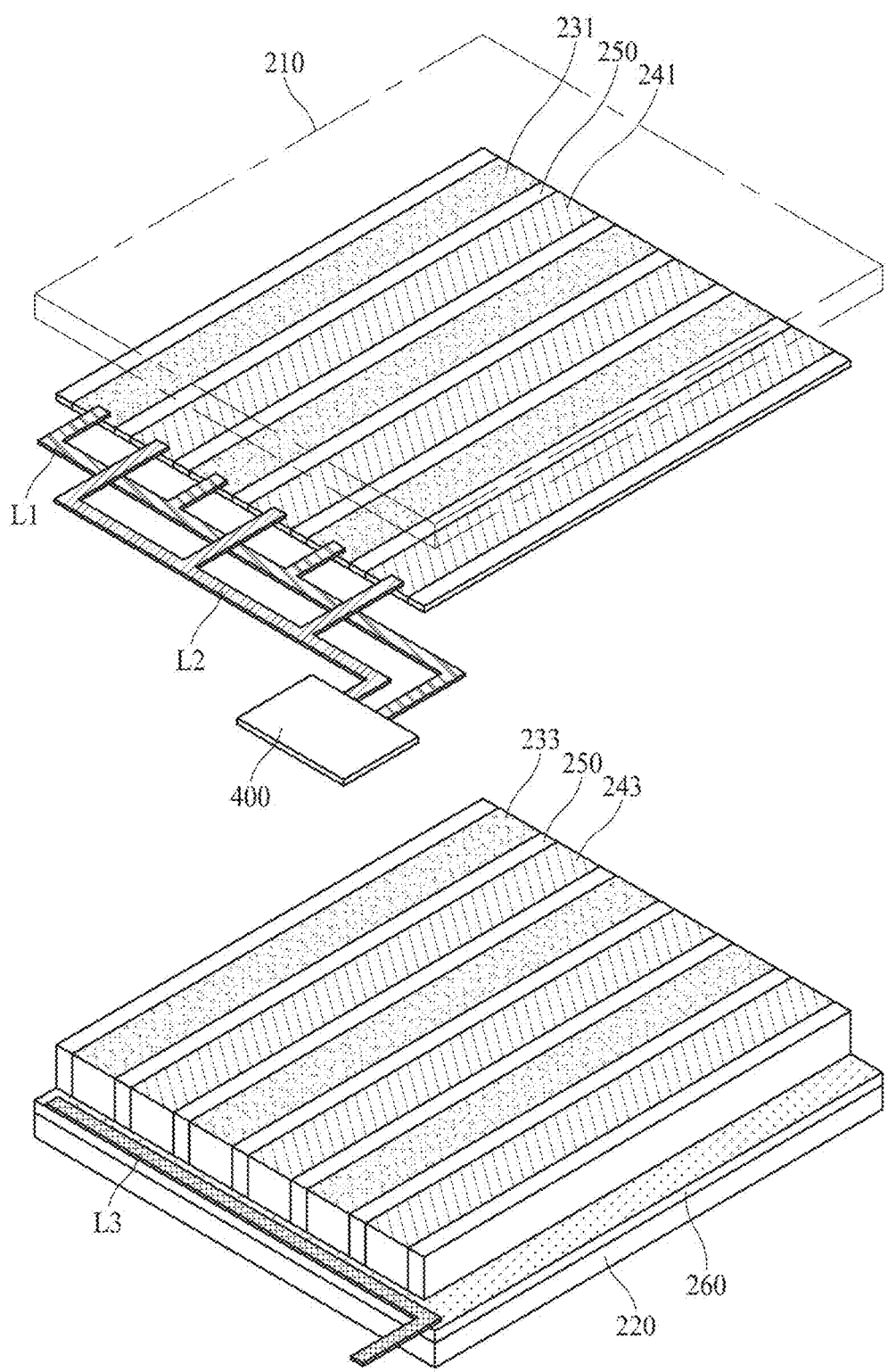
FIG. 7 is a plan view illustrating an arrangement of electrodes and lines in a display apparatus according to another embodiment of the present disclosure.

FIG. 6 is a cross-sectional view of a display apparatus according to another embodiment of the present disclosure. FIG. 7 illustrates an arrangement of electrodes and lines in the display apparatus according to another embodiment of the present disclosure.

Here, the display apparatus of FIGS. 6 and 7 may further include a common electrode 260 unlike the display apparatus of each of FIGS. 3 to 5. Thus, the same elements as the above-described elements will be briefly described below or their descriptions are omitted.

With reference to FIGS. 6 and 7, a light-controlling device 200 may be on a rear surface of a display panel 100. In a light transmission mode, the light-controlling device 200 may transmit light incident thereon. In a light-blocking mode, the light-controlling device 200 may block light incident thereon. For example, the light-controlling device 200 may include a first substrate 210, a second substrate 220, a transmission controller 230, a vibration generator 240, a partition wall 250, and a common electrode 260.

The first substrate 210 and the second substrate 220 may face each other. For example, each of the first and second substrates 210 and 220 may be a base substrate, and may be a flexible substrate. For example, each of the first and second substrates 210 and 220 may include a transparent polyimide material.

The transmission controller 230 may be between the first and second substrates 210 and 220, and may overlap a transmissive area TA of the display panel 100. For example, the transmission controller 230 may include a first electrode 231 and an electrochromic layer 233.

The first electrode 231 may be on one surface of the first substrate 210 facing the second substrate 220, and may overlap the transmissive area TA of the display panel 100. For example, the first electrode 231 may be patterned on the one surface of the first substrate 210 to overlap the transmissive area TA of each of a plurality of pixels P of the display panel 100. The first electrode 231 may be connected to a first line L1 at a pad part PAD of the first substrate 210, and may be provided with a first electric signal from a driving circuit unit 400 through the first line L1. Here, the first electric signal may correspond to a data signal for determining the electrical color conversion of the electrochromic layer 233.

The electrochromic layer 233 may be between the first electrode 231 and the common electrode 260. When a voltage is applied to the first electrode 231 and the common electrode 260, a color of the electrochromic layer 233 may be electrically converted. According to an embodiment, the electrochromic layer 233 may include a color conversion layer, an electrolyte layer, and a counter layer. For example, the driving circuit unit 400 may provide the first electric signal to the first electrode 231 through the first line L1, and may provide the common electrode 260 with a signal differing from the first electric signal through a third line L3. When a voltage is applied to the first electrode 231 and the common electrode 260, an electrochemical oxidation-reduction reaction may be performed in the electrochromic layer 233. Thus, a color of the electrochromic layer 233 may be converted.

The vibration generator 240 may be between the first and second substrates 210 and 220, and may overlap an emissive area EA of the display panel 100. For example, the vibration generator 240 may include a third electrode 241 and a vibration generating layer 243.

The third electrode 241 may be on the one surface of the first substrate 210 facing the second substrate 220, and may overlap the emissive area EA of the display panel 100. For example, the third electrode 241 may be patterned on the one surface of the first substrate 210 to overlap the emissive area EA of each of the plurality of pixels P of the display panel 100. As described above, the first electrode 231 and the third electrode 241 may be alternately disposed on the one surface of the first substrate 210 so that the first electrode 231 overlaps the transmissive area TA of the display panel 100, and the third electrode 241 overlaps the emissive area EA of the display panel 100. The third electrode 241 may be connected to a second line L2 at the pad part PAD of the first substrate 210, and may be provided with a second electric signal from the driving circuit unit 400 through the second line L2. Here, the second line L2 may be electrically insulated from the first line L1. The second electric signal may be generated based on sound data, and thus may correspond to a sound signal for determining a vibration of the vibration generating layer 243.

The vibration generating layer 243 may be between the third electrode 241 and the common electrode 260. When a voltage is applied to the third electrode 241 and the common electrode 260, the vibration generating layer 243 may vibrate to output sound. For example, the driving circuit unit 400 may provide the second electric signal to the third electrode 241 through the second line L2, and may provide the common electrode 260 with a signal differing from the second electric signal. When a voltage is applied to the third electrode 241 and the common electrode 260, the vibration generating layer 243 may vibrate with a magnetic field based on the inverse piezoelectric effect.

According to an embodiment, the light-controlling device 200 may control a sound signal provided to the third electrode 241 and the common electrode 260 to vibrate the vibration generator 240, and may transfer a vibration to the display panel 100, thereby outputting sound SW toward a forward region in front of the display apparatus. Therefore, the display apparatus may output the sound SW toward the forward region in front of the display apparatus, even without a separate vibration generating device. Thus, an image-generating position may match a sound-generating position of the sound SW, thereby enhancing an immersion experience of a viewer watching an image, and enhancing a degree of design freedom of the display apparatus.

Moreover, in the display apparatus according to an embodiment, to realize the light transmission mode, the transmission controller 230 of the light-controlling device 200, corresponding to the transmissive area TA of the display panel 100, may be transparent. For example, in the display apparatus according to the present disclosure, when the transmission controller 230 is transparent, regardless of whether the emissive area EA of the display panel 100 is transparent, the light transmission mode may be realized. Therefore, the vibration generator 240 may overlap the emissive area EA of the display panel 100, and thus, may not be seen. Therefore, in the display apparatus according to the present disclosure, the vibration generator 240 may correspond to the emissive area EA of the light-controlling device 200. Thus, the light transmission mode and the light-blocking mode may be realized, and the sound SW may be output toward a forward region FD in front of the display apparatus.

The partition wall 250 may be between the transmission controller 230 and the vibration generator 240 in a state of maintaining an interval between the first substrate 210 and the common electrode 260. For example, the partition wall 250 may be provided in plurality, and each of the plurality of partition walls 250 may be disposed between adjacent transmission controllers 230 and vibration generators 240 among a plurality of transmission controllers 240 and vibration generators, which may be alternately disposed, and thus, may divide the transmission controllers 230 and the vibration generators 240. Also, the partition wall 250 may be on the first substrate 210, and may perform a function of a mask in a process of patterning the first electrode 231 and the third electrode 241. Alternatively, the partition wall 250 may be on the common electrode 260, and may divide the transmission controller 230 and the vibration generator 240 in a forming process of the electrochromic layer 233 and the vibration generating layer 243.

The common electrode 260 may be on one surface of the second substrate 220 facing the first substrate 210. For example, the common electrode 260 may be on the one surface of the second substrate 220 to overlap a whole display area AA of the display panel 100. For example, the common electrode 260 may correspond to an integration electrode overlapping all of a plurality of transmission controllers 230 and vibration generators 240, which may be alternatively disposed.

According to an embodiment, the driving circuit unit 400 may provide a respective independent electric signal to each of the first electrode 231 and the third electrode 241. For example, the driving circuit unit 400 may provide the first electric signal to the first electrode 231 through the first line L1, and may provide the second electric signal to the third electrode 241 through the second line L2 electrically insulated from the first line L1. For example, the driving circuit unit 400 may provide different electric signals to each of the first electrode 231 and the third electrode 241. Thus, even when one electric signal is provided to the common electrode 260 corresponding to all of the first electrode 231 and the third electrode 241, the driving circuit unit 400 may independently drive each of the transmission controller 230 and the vibration generator 240. Therefore, the light-controlling device 200 may include the common electrode 260 on a whole (or entire) surface of one surface of the second substrate 220, a mask for independently driving each of the transmission controller 230 and the vibration generator 240 may be omitted, and thus, the process cost may be reduced.

Figure 8:
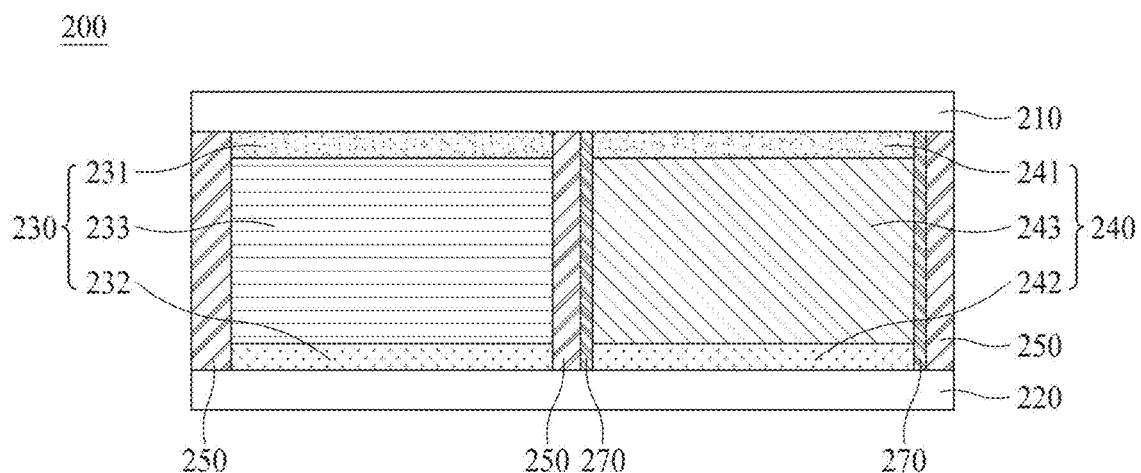
FIG. 8 illustrates an embodiment of a sound-absorbing member in a display apparatus according to an embodiment of the present disclosure.

FIG. 8 illustrates an embodiment of a sound-absorbing member in a display apparatus according to an embodiment of the present disclosure.

With reference to FIG. 8, a light-controlling device 200 may further include a sound-absorbing member 270 that surrounds a vibration generator 240 facing a transmission controller 230 on each of both portions of the vibration generator 240. Here, the sound-absorbing member 270 may include a material that is low in elasticity, and may absorb a vibration generated by the vibration generator 240. For example, the sound-absorbing member 270 may be implemented as a foam pad, and thus, may reduce or prevent the leakage of the vibration generated by the vibration generator 240.

According to an embodiment, the sound-absorbing member 270 may be between a partition wall 250 and the vibration generator 240. Therefore, the partition wall 250 may surround both surfaces of the transmission controller 230, and the sound-absorbing member 270 may surround both surfaces of the vibration generator 240. According to an embodiment, a front surface and a rear surface of the vibration generator 240 may be respectively covered by a first substrate 210 and a second substrate 220, and both surfaces of the vibration generator 240 may be covered by the sound-absorbing member 270. Therefore, the sound-absorbing member 270 may reduce or prevent the vibration generated by the vibration generator 240 from being transferred to a side surface of the vibration generator 240, thereby reducing or preventing the vibration generated by the vibration generator 240 from being transferred to the transmission controller 230. Accordingly, the sound-absorbing member 270 may reduce or prevent a light-blocking mode and a light transmission mode of the transmission controller 230 from being abnormally performed by a vibration, and may enhance a vibration transfer characteristic of the vibration of the vibration generator 240 corresponding to a display panel 100, thereby enhancing a sound pressure level (SPL).

Figure 9:
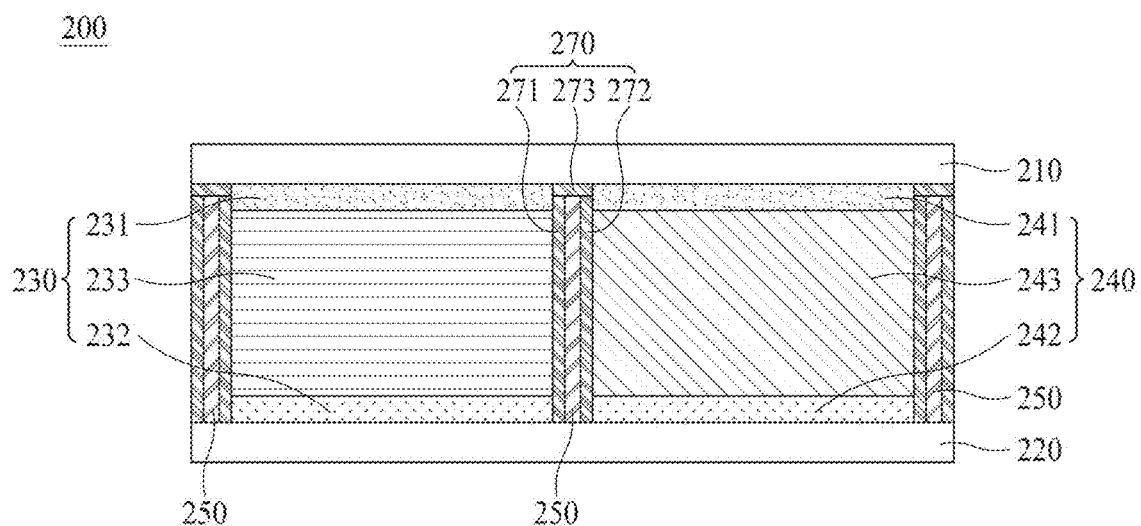
FIG. 9 illustrates another embodiment of a sound-absorbing member in a display apparatus according to an embodiment of the present disclosure.

FIG. 9 illustrates another embodiment of a sound-absorbing member in a display apparatus according to an embodiment of the present disclosure.

With reference to FIG. 9, a light-controlling device 200 may further include a sound-absorbing member 270 between a transmission controller 230 and a vibration generator 240, and surrounding a partition wall 250. According to an embodiment, the partition wall 250 may have an adhesive force that is higher than that of the sound-absorbing member 270. For example, the sound-absorbing member 270 may include a material that is low in elasticity, and may absorb a vibration generated by the vibration generator 240. Also, the sound-absorbing member 270 may be attached to the partition wall 250, and may be stably disposed between the transmission controller 230 and the vibration generator 240.

According to an embodiment, the sound-absorbing member 270 may be between the transmission controller 230 and the vibration generator 240. For example, the sound-absorbing member 270 may include first to third portions 271 to 273. The first portion 271 may surround one surface of the transmission controller 230, and the second portion 272 may surround one surface of the vibration generator 240 facing one surface of the transmission controller 230. The third portion 273 may be between the transmission controller 230 and the vibration generator 240 at one surface of a first substrate 210, and may be connected to the first portion 271 and the second portion 272. For example, a front surface and a rear surface of the transmission controller 230 may be respectively covered by the first substrate 210 and a second substrate 220, and both surfaces or both portions of the transmission controller 230 may be covered by the first portion 271 of the sound-absorbing member 270. Also, a front surface and a rear surface of the vibration generator 240 may be respectively covered by the first substrate 210 and the second substrate 220, and both surfaces of the vibration generator 240 may be covered by the second portion 272 of the sound-absorbing member 270. Also, after a plurality of partition walls 250 are provided on the second substrate 220, each of the first to third portions 271 to 273 may be formed, and thus, may surround three surfaces of different partition walls 250. Therefore, the sound-absorbing member 270 of FIG. 9 may have a shape differing from that of the sound-absorbing member 270 of FIG. 8, and may have a vibration absorption rate that is higher than that of the sound-absorbing member 270 of FIG. 8.

Therefore, the sound-absorbing member 270 may reduce or prevent a vibration generated by the vibration generator 240 from being transferred to a side surface of the vibration generator 240. Thus, the sound-absorbing member 270 may reduce or prevent the vibration generated by the vibration generator 240 from being transferred to the transmission controller 230, thereby enhancing a vibration transfer characteristic of the vibration of the vibration generator 240 corresponding to a display panel 100 to enhance a sound pressure level (SPL).

Figure 10:
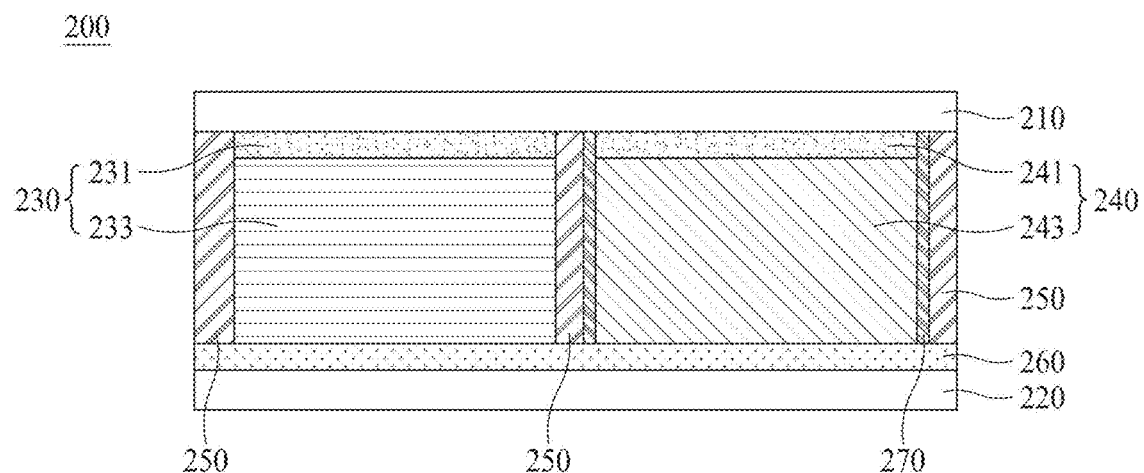
FIG. 10 illustrates an embodiment of a sound-absorbing member in a display apparatus according to another embodiment of the present disclosure.

FIG. 10 illustrates an embodiment of a sound-absorbing member in a display apparatus according to another embodiment of the present disclosure.

With reference to FIG. 10, a light-controlling device 200 may further include a sound-absorbing member 270 that may surround both surfaces of a vibration generating layer 243 facing a transmission controller 230 on each of both sides of the vibration generating layer 243. According to an embodiment, the sound-absorbing member 270 may be between a partition wall 250 and the vibration generating layer 243. Therefore, the partition wall 250 may surround both surfaces of the transmission controller 230, and the sound-absorbing member 270 may surround both surfaces of a vibration generator 240. According to an embodiment, a front surface and a rear surface of the vibration generating layer 243 may be respectively covered by a third electrode 241 and a common electrode 260, and both surfaces of the vibration generating layer 243 may be covered by the sound-absorbing member 270.

Accordingly, the sound-absorbing member 270 may reduce or prevent a vibration generated by the vibration generating layer 243 from being transferred to a side surface of the vibration generating layer 243. Thus, the sound-absorbing member 270 may reduce or prevent the vibration generated by the vibration generating layer 243 from being transferred to the transmission controller 230, thereby enhancing a vibration transfer characteristic of the vibration of the vibration generating layer 243 corresponding to a display panel 100 to enhance a sound pressure level (SPL).

Figure 11:
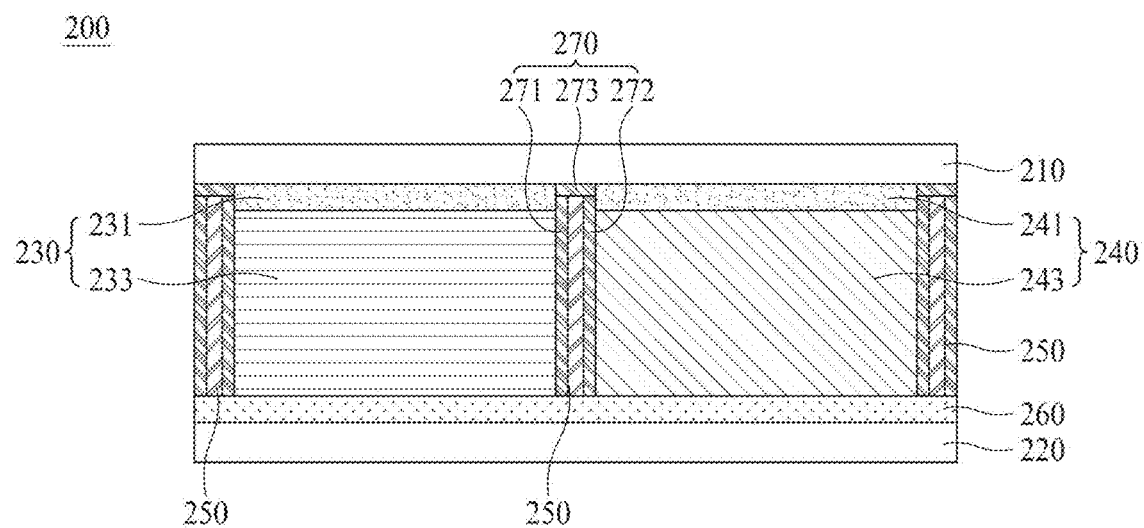
FIG. 11 illustrates another embodiment of a sound-absorbing member in a display apparatus according to another embodiment of the present disclosure.

FIG. 11 illustrates another embodiment of a sound-absorbing member in a display apparatus according to another embodiment of the present disclosure.

With reference to FIG. 11, a light-controlling device 200 may further include a sound-absorbing member 270 between a transmission controller 230 and a vibration generator 240, and surrounding a partition wall 250. According to an embodiment, the sound-absorbing member 270 may be between an electrochromic layer 233 and a vibration generating layer 243. For example, the sound-absorbing member 270 may include first to third portions 271 to 273. The first portion 271 may surround one surface of the electrochromic layer 233, and the second portion 272 may surround one surface of the vibration generating layer 243 facing one surface of the electrochromic layer 233. The third portion 273 may be between the transmission controller 230 and the vibration generator 240 at one surface of a first substrate 210, and may be connected to the first portion 271 and the second portion 272. For example, a front surface and a rear surface of the electrochromic layer 233 may be respectively covered by the first substrate 210 and a common electrode 260, and both surfaces of the electrochromic layer 233 may be covered by the first portion 271 of the sound-absorbing member 270. Also, a front surface and a rear surface of the vibration generating layer 243 may be respectively covered by the first substrate 210 and the common electrode 260, and both surfaces of the vibration generating layer 243 may be covered by the second portion 272 of the sound-absorbing member 270. Also, after a plurality of partition walls 250 are provided on the common electrode 260, each of the first to third portions 271 to 273 may be formed, and thus, may surround three surfaces of different partition walls 250. Therefore, the sound-absorbing member 270 of FIG. 11 may have a shape differing from that of the sound-absorbing member 270 of FIG. 10, and may have a vibration absorption rate that is higher than that of the sound-absorbing member 270 of FIG. 10.

Therefore, the sound-absorbing member 270 may reduce or prevent a vibration generated by the vibration generator 240 from being transferred to a side surface of the vibration generator 240. Thus, the sound-absorbing member 270 may reduce or prevent the vibration generated by the vibration generator 240 from being transferred to the transmission controller 230, thereby enhancing a vibration transfer characteristic of the vibration of the vibration generator 240 corresponding to a display panel 100 to enhance a sound pressure level (SPL).

Figure 12:
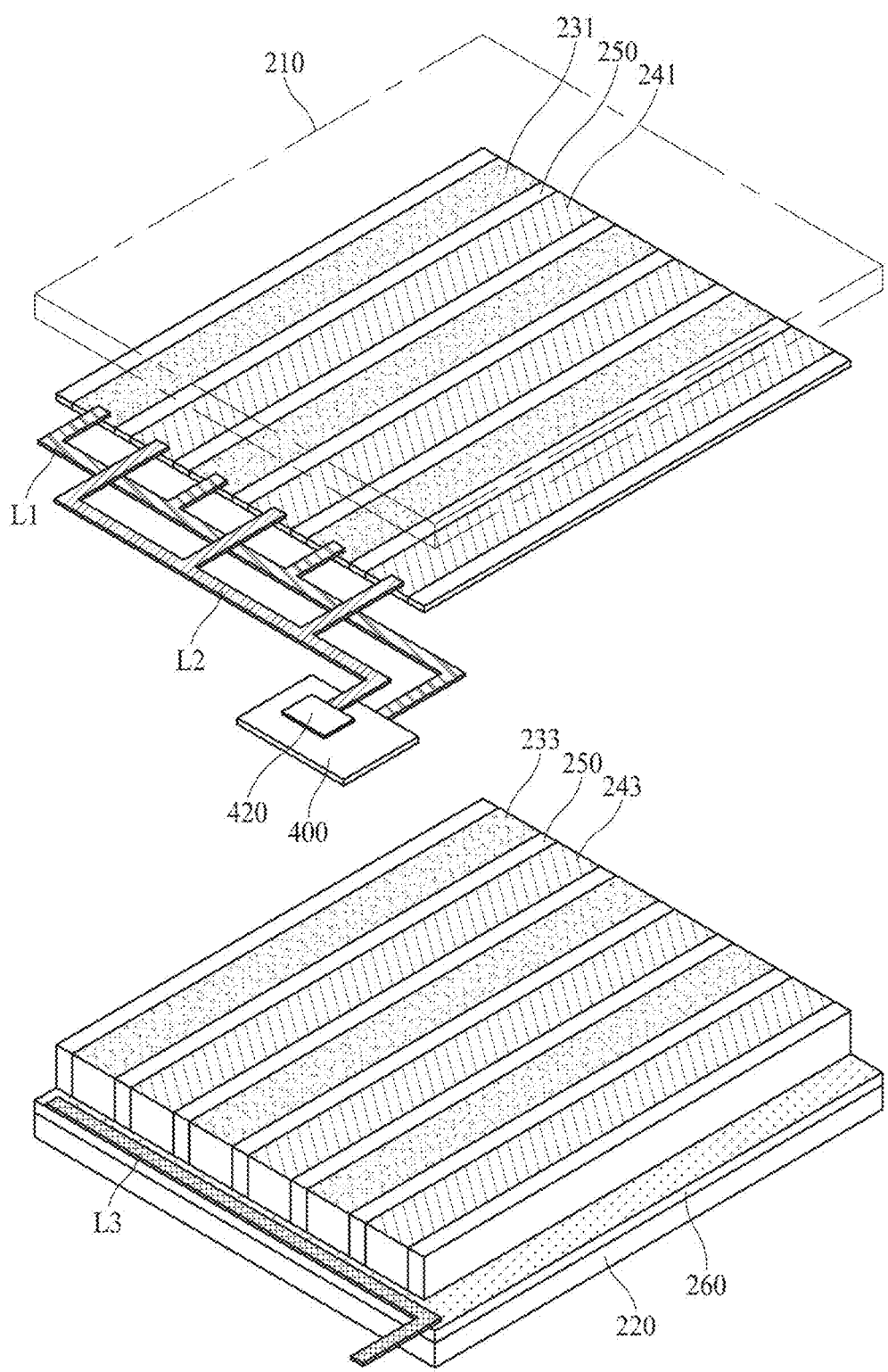
FIG. 12 illustrates a low frequency amplifier in a display apparatus according to an embodiment of the present disclosure.

FIG. 12 illustrates a low frequency amplifier in a display apparatus according to an embodiment of the present disclosure.

With reference to FIG. 12, a light-controlling device 200 may further include a low frequency amplifier 420 that may amplify a second electric signal that may have a low frequency domain, and may be provided to a third electrode 243. Here, the low frequency amplifier 420 may be embedded into a driving circuit unit 400, or may be connected between the driving circuit unit 400 and a second line L2.

To solve a problem in which a sound pressure level corresponding to the low frequency domain is reduced, the low frequency amplifier 420 may amplify a low frequency component of a sound signal or the second electric signal provided to the third electrode 243. For example, the low frequency amplifier 420 may remove the noise and/or howling of the sound signal, and may amplify the low frequency component. The low frequency amplifier 420 may not be connected to a first line L1, and may amplify only the sound signal provided to the third electrode 241 through the second line L2.

The display panel applied to the display apparatus according to an embodiment of the present disclosure may be any type of display panel, such as a liquid crystal display panel, an organic light-emitting diode display panel, a quantum dot light-emitting display panel, and an electroluminescent display panel, but is not limited to a specific display panel. For example, the display panel according to the present disclosure may use any display panel that may be vibrated by the sound generator according to the present disclosure to generate sound. Also, the display apparatus according to an embodiment of the present disclosure may include a display panel including, for example, an organic light-emitting layer, a quantum dot light-emitting layer, and a micro light-emitting diode.

Moreover, the vibration generator according to an embodiment of the present disclosure may be applied to a display apparatus. The display apparatus according to an embodiment of the present disclosure may be applied to a mobile device, a video phone, a smart watch, a watch phone, a wearable device, a foldable device, a rollable device, a bendable device, a flexible device, a curved device, a portable multimedia player (PMP), a personal digital assistant (PDA), an electronic organizer, a desktop personal computer (PC), a laptop PC, a netbook computer, a workstation, a navigation device, an automotive navigation device, an automotive display device, a television (TV), a wall paper, a signage device, a game machine, a lighting device, a notebook computer, a monitor, a camera, a camcorder, a home appliance, etc.

The display apparatus according to the present disclosure may output sound toward a forward region in front of the display apparatus using the light-controlling device, including the vibration generator overlapping the emissive area of the display panel.

Moreover, the display apparatus according to the present disclosure may independently drive each of the transmission controller and the vibration generator of the light-controlling device to output sound toward a forward region in front of the display apparatus in the light transmission mode or the light-blocking mode.

Moreover, the display apparatus according to the present disclosure may output sound toward a forward region in front of the display panel to match an image-generating position with a sound-generating position, thereby increasing or maximizing a sense of reality and an immersion experience.

A display apparatus according to an embodiment of the present disclosure will be described below.

According to an embodiment of the present disclosure, a display apparatus may include: a display panel including: a transmissive area configured to transmit light incident thereon, and an emissive area configured to emit light, a light-controlling device on a rear surface of the display panel, the light-controlling device being configured to have a light transmission mode for transmitting the incident light and a light-blocking mode for blocking the incident light, the light-controlling device including: a first substrate and a second substrate facing each other, a transmission controller between the first substrate and the second substrate, the transmission controller overlapping the transmissive area, and a vibration generator between the first substrate and the second substrate, the vibration generator overlapping the emissive area.

For example, in the display apparatus according to an embodiment of the present disclosure, the transmission controller may include: a first electrode on the first substrate, the first electrode overlapping the transmissive area, a second electrode on the second substrate, the second electrode corresponding to the first electrode, and an electrochromic layer having a color that may be converted based on a voltage applied to the first and second electrodes. For example, in the display apparatus according to an embodiment of the present disclosure, the vibration generator may include: a third electrode on the first substrate and overlapping the emissive area, a fourth electrode on the second substrate and corresponding to the third electrode, and a vibration generating layer configured to vibrate based on a voltage applied to the third and fourth electrodes to output sound.

For example, in the display apparatus according to an embodiment of the present disclosure, each of the first electrode and the third electrode may be provided in plurality, and the plurality of first electrodes and the plurality of third electrodes may be alternately arranged. For example, in the display apparatus according to an embodiment of the present disclosure, the light-controlling device may further include a driving circuit unit configured to provide a respective independent electric signal to each of the first electrode and the third electrode.

For example, in the display apparatus according to an embodiment of the present disclosure, the driving circuit unit may be further configured to: provide a first electric signal to the first electrode through a first line, and provide a second electric signal to the third electrode through a second line electrically insulated from the first line. For example, in the display apparatus according to an embodiment of the present disclosure, the light-controlling device may further include a low frequency amplifier configured to amplify a second electric signal having a low frequency domain provided to the third electrode.

For example, in the display apparatus according to an embodiment of the present disclosure, the light-controlling device may further include a partition wall between the transmission controller and the vibration generator. For example, in the display apparatus according to an embodiment of the present disclosure, the light-controlling device may further include a sound-absorbing member between the transmission controller and the vibration generator, the sound-absorbing member surrounding the partition wall. For example, in the display apparatus according to an embodiment of the present disclosure, the sound-absorbing member may include: a first portion surrounding one surface of the transmission controller, a second portion surrounding one surface of the vibration generator facing the one surface of the transmission controller, and a third portion connected to the first portion and the second portion, the third portion being between the transmission controller and the vibration generator at one surface of the first substrate.

For example, in the display apparatus according to an embodiment of the present disclosure, the light-controlling device may further include a common electrode on the second substrate. For example, in the display apparatus according to an embodiment of the present disclosure, the transmission controller may include: a first electrode on the first substrate and overlapping the transmissive area of the display panel, and an electrochromic layer having a color that may be converted based on a voltage applied to the first electrode and the common electrode. For example, in the display apparatus according to an embodiment of the present disclosure, the vibration generator may include: a third electrode on the first substrate and overlapping the emissive area of the display panel, and a vibration generating layer configured to vibrate based on a voltage applied to the third electrode and the common electrode to output sound.

For example, in the display apparatus according to an embodiment of the present disclosure, each of the first electrode and the third electrode may be provided in plurality, and the plurality of first electrodes and the plurality of third electrodes may be alternately arranged. For example, in the display apparatus according to an embodiment of the present disclosure, the light-controlling device may further include a driving circuit unit configured to provide a respective independent electric signal to each of the first electrode and the third electrode. For example, in the display apparatus according to an embodiment of the present disclosure, the driving circuit unit may be further configured to: provide a first electric signal to the first electrode through a first line, and provide a second electric signal to the third electrode through a second line electrically insulated from the first line. For example, in the display apparatus according to an embodiment of the present disclosure, the light-controlling device may further include a low frequency amplifier configured to amplify a second electric signal having a low frequency domain provided to the third electrode.

For example, in the display apparatus according to an embodiment of the present disclosure, the light-controlling device may further include a sound-absorbing member surrounding both portions of the vibration generator facing the transmission controller on each of both portions of the vibration generator. For example, in the display apparatus according to an embodiment of the present disclosure, the display panel may include: an upper substrate and a lower substrate facing each other, and a pixel array layer including: a thin film transistor on the lower substrate, a light-emitting device electrically connected to the thin film transistor, and a color filter on one surface of the upper substrate facing the lower substrate. For example, in the display apparatus according to an embodiment of the present disclosure, each of the thin film transistor, the light-emitting device, and the color filter may be in the emissive area of the display panel and may overlap the vibration generator.

According to an embodiment of the present disclosure, a display apparatus may include: a display panel including: a transmissive area, and an emissive area, and a light-controlling device on a rear surface of the display panel, the light-controlling device including: a transmission controller corresponding to the transmissive area, a vibration generator corresponding to the emissive area, and a sound-absorbing member around the vibration generator.

For example, in the display apparatus according to an embodiment of the present disclosure, the light-controlling device may further include a partition wall between the transmission controller and the vibration generator. For example, in the display apparatus according to an embodiment of the present disclosure, the sound-absorbing member may be between the partition wall and the vibration generator.

For example, in the display apparatus according to an embodiment of the present disclosure, the transmission controller may include: a first electrode corresponding to the transmissive area, a second electrode opposite to the first electrode, and an electrochromic layer having a color that may be converted based on a voltage applied to the first and second electrodes. For example, in the display apparatus according to an embodiment of the present disclosure, the vibration generator may include: a third electrode corresponding to the emissive area, a fourth electrode opposite to the third electrode, and a vibration generating layer configured to vibrate based on a voltage applied to the third and fourth electrodes to output sound.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display apparatus, comprising:
    a display panel comprising:
        a transmissive area configured to transmit light incident thereon; and
        an emissive area configured to emit light;
    a light-controlling device on a rear surface of the display panel, the light-controlling device being configured to have a light transmission mode for transmitting the incident light and a light-blocking mode for blocking the incident light, the light-controlling device comprising:
        a first substrate and a second substrate facing each other;
        a transmission controller between the first substrate and the second substrate, the transmission controller overlapping the transmissive area, excepting the emissive area; and
        a vibration generator between the first substrate and the second substrate, the vibration generator overlapping the emissive area, excepting the transmissive area.

2. The display apparatus of claim 1, wherein the transmission controller comprises:
    a first electrode on the first substrate, the first electrode overlapping the transmissive area;
    a second electrode on the second substrate, the second electrode corresponding to the first electrode; and
    an electrochromic layer having a color that is converted based on a voltage applied to the first and second electrodes.

3. The display apparatus of claim 2, wherein the vibration generator comprises:
    a third electrode on the first substrate and overlapping the emissive area;
    a fourth electrode on the second substrate and corresponding to the third electrode; and
    a vibration generating layer configured to vibrate based on a voltage applied to the third and fourth electrodes to output sound.

4. The display apparatus of claim 3, wherein:
    each of the first electrode and the third electrode is provided in plurality; and
    the plurality of first electrodes and the plurality of third electrodes are alternately arranged.

5. The display apparatus of claim 3, wherein the light-controlling device further comprises a driving circuit unit configured to provide a respective independent electric signal to each of the first electrode and the third electrode.

6. The display apparatus of claim 5, wherein the driving circuit unit is further configured to:
    provide a first electric signal to the first electrode through a first line; and
    provide a second electric signal to the third electrode through a second line electrically insulated from the first line.

7. The display apparatus of claim 3, wherein the light-controlling device further comprises a low frequency amplifier configured to amplify a second electric signal having a low frequency domain provided to the third electrode.

8. The display apparatus of claim 1, wherein the light-controlling device further comprises a partition wall between the transmission controller and the vibration generator.

9. The display apparatus of claim 8, wherein the light-controlling device further comprises a sound-absorbing member between the transmission controller and the vibration generator, the sound-absorbing member surrounding the partition wall.

10. The display apparatus of claim 9, wherein the sound-absorbing member comprises:
    a first portion surrounding one surface of the transmission controller;

a second portion surrounding one surface of the vibration generator facing the one surface of the transmission controller; and a third portion connected to the first portion and the second portion, the third portion being between the transmission controller and the vibration generator at one surface of the first substrate.

11. The display apparatus of claim 1, wherein the light-controlling device further comprises a common electrode on the second substrate.

12. The display apparatus of claim 11, wherein the transmission controller comprises:

a first electrode on the first substrate and overlapping the transmissive area of the display panel; and an electrochromic layer having a color that is converted based on a voltage applied to the first electrode and the common electrode.

13. The display apparatus of claim 12, wherein the vibration generator comprises:

a third electrode on the first substrate and overlapping the emissive area of the display panel; and a vibration generating layer configured to vibrate based on a voltage applied to the third electrode and the common electrode to output sound.

14. The display apparatus of claim 13, wherein:

each of the first electrode and the third electrode is provided in plurality; and the plurality of first electrodes and the plurality of third electrodes are alternately arranged.

15. The display apparatus of claim 13, wherein the light-controlling device further comprises a driving circuit unit configured to provide a respective independent electric signal to each of the first electrode and the third electrode.

16. The display apparatus of claim 15, wherein the driving circuit unit is further configured to:

provide a first electric signal to the first electrode through a first line; and provide a second electric signal to the third electrode through a second line electrically insulated from the first line.

17. The display apparatus of claim 13, wherein the light-controlling device further comprises a low frequency amplifier configured to amplify a second electric signal having a low frequency domain provided to the third electrode.

18. The display apparatus of claim 1, wherein the light-controlling device further comprises a sound-absorbing member surrounding both portions of the vibration generator facing the transmission controller on each of both portions of the vibration generator.

19. The display apparatus of claim 1, wherein the display panel comprises:

an upper substrate and a lower substrate facing each other; and a pixel array layer comprising:

a thin film transistor on the lower substrate;

a light-emitting device electrically connected to the thin film transistor; and a color filter on one surface of the upper substrate facing the lower substrate.

20. The display apparatus of claim 19, wherein each of the thin film transistor, the light-emitting device, and the color filter is in the emissive area of the display panel and overlap the vibration generator.

21. A display apparatus, comprising:

a display panel comprising:

a transmissive area; and an emissive area; and a light-controlling device on a rear surface of the display panel, the light-controlling device comprising:

a transmission controller corresponding to the transmissive area, excepting the emissive area;

a vibration generator corresponding to the emissive area, excepting the transmissive area; and a sound-absorbing member around the vibration generator.

22. The display apparatus of claim 21, wherein the light-controlling device further comprises a partition wall between the transmission controller and the vibration generator.

23. The display apparatus of claim 22, wherein the sound-absorbing member is between the partition wall and the vibration generator.

24. The display apparatus of claim 21, wherein the transmission controller comprises:

a first electrode corresponding to the transmissive area;

a second electrode opposite to the first electrode; and an electrochromic layer having a color that is converted based on a voltage applied to the first and second electrodes.

25. The display apparatus of claim 21, wherein the vibration generator comprises:

a third electrode corresponding to the emissive area;

a fourth electrode opposite to the third electrode; and a vibration generating layer configured to vibrate based on a voltage applied to the third and fourth electrodes to output sound.

* * * * *